United States Patent
Park et al.

(12)

(10) Patent No.: US 6,445,172 B1
(45) Date of Patent: Sep. 3, 2002

(54) WAFER PROBING SYSTEM AND METHOD OF CALIBRATING WAFER PROBING NEEDLE USING THE SAME

(75) Inventors: Seok-ho Park, Yongin; Ki-sang Kang, Suwon; Se-jang Oh, Anyang, all of (KR)

(73) Assignee: Samsung Electronics Co., Ltd., Hwasung (KR)

(*) Notice: Subject to any disclaimer, the term of this patent is extended or adjusted under 35 U.S.C. 154(b) by 6 days.

(21) Appl. No.: 09/620,016

(22) Filed: Jul. 20, 2000

(30) Foreign Application Priority Data

Jul. 22, 1999 (KR) .......................................... 99-29733

(51) Int. Cl.[7] .............................................. G01R 31/28
(52) U.S. Cl. ..................... 324/158.1; 324/758; 324/765
(58) Field of Search ................................ 324/754, 757, 324/758, 765, 158.1; 714/700

(56) References Cited

U.S. PATENT DOCUMENTS 5,220,279 A * 6/1993 Nagasawa ................... 324/754
5,666,063 A * 9/1997 Abercrombie et al. ....... 324/754
5,727,021 A * 3/1998 Truebenbach ............... 714/700
5,968,282 A * 10/1999 Yamasaka ................... 324/754

* cited by examiner

*Primary Examiner*—Ernest Karlsen
(74) *Attorney, Agent, or Firm*—Marger Johnson & McCollom, P.C.

(57) ABSTRACT

A wafer probing system, and a wafer-probing needle calibrating method using the same are provided. The system comprises a main support, a wafer chuck mounted on the main support, a needle chuck for contacting one of the plurality of needles. The needle chuck is comprised of a conductive signal line, and a shield line for shielding the signal line. Further, the system includes positioning means, for determining the position of the plurality of needles, moving means, for vertically moving the needle chuck, being coupled to the support, and means for horizontally moving the support based on the determined position of the plurality of needles. With the present invention system and method, signals applied to wafer probing needles can be accurately calibrated.

16 Claims, 7 Drawing Sheets

WAFER PROBING SYSTEM AND METHOD OF CALIBRATING WAFER PROBING NEEDLE USING THE SAME

BACKGROUND OF THE INVENTION

1. Field of the Invention

The present invention relates to a wafer probing system, and more particularly, to a wafer probing system including wafer probing needles, and a method of calibrating timing of signals for the wafer probing system.

2. Description of the Related Art

Generally, a plurality of integrated circuit chips are formed on one wafer. Integrated circuit chips need to be electrically connected to testing equipment in order to measure the electrical performance thereof. Integrated circuit chips are too small to be directly connected to the testing equipment. Thus, a probing card having a plurality of needles is connected to the testing equipment, and the appropriate needles contact appropriate bonding pads of a particular integrated circuit chips on the wafer. This way, the electrical performance of the integrated circuit chips is measured. Here, the testing equipment is connected to the plurality of needles via one of a plurality of signal wires. Each signal wire must have the same signal delivery characteristics. However, in many cases, each signal wire has different signal delivery characteristics because the characteristics of signal wires can vary during the manufacturing thereof. Signals used in integrated circuit chips are so sensitive that if signal wires have different characteristics, signals output from the testing equipment reach the needles at different times via the signal wires. As a result, the electrical characteristics of integrated circuit chips cannot be accurately measured. Accordingly, in order to measure the electrical characteristics of integrated circuit chips accurately, the electrical characteristics of signal wires should be accurately measured. Then, the signals, which are applied from the testing equipment to the needles, can be controlled in accordance with the accurately measured electrical characteristics of signal wires. This is referred to as signal calibration.

Conventionally, however, all of the needles are made to come into electrical contact with the bonding pads of integrated circuit chips for the signal calibration, while a wafer is loaded on a wafer chuck in a wafer probing system. Therefore, the testing equipment cannot accurately calibrate the waveforms of signals which reach the needles.

SUMMARY OF THE INVENTION

An objective of the present invention is to provide a wafer probing system that contacts wafer probing needles, one at a time.

Another objective of the present invention is to provide a method of calibrating wafer-probing needles. With this method, signals applied to the wafer probing needles can be accurately calibrated.

Accordingly, to achieve the first objective, the present invention provides a wafer probing system including a probe card on which a plurality of needles are mounted. The system includes a main support, a wafer chuck mounted on the support, and a needle contact for individually contacting one of the plurality of needles. The needle contact is comprised of a conductive signal line, and a shield line for shielding the signal line. Further, the system includes positioning means, for determining the position of the plurality of needles, being mounted on the support, moving means, for vertically moving the needle contact, being coupled to the support, and means for horizontally moving the support based on the determined position of the plurality of needles. The needle contact includes a conductive signal line and a shield line for shielding the signal line.

Preferably, the moving means includes a needle contact support, a rail for vertically moving the needle contact support, a motor for moving the rail, and a needle contact controller for controlling the motor.

In another embodiment of the present invention, a wafer probing system includes a wafer chuck on which the wafer is loaded. The system also comprises a wafer chuck support including means for moving the wafer chuck horizontally and vertically. The wafer chuck support further includes a needle contact for contacting one of the plurality of needles. Also, means for determining the positions of the plurality of needles such as a camera is mounted on the wafer chuck support. In addition, a controller is provided for receiving data on the positions of the plurality of needles from said positioning means. The controller controls the motion of the needle contact and wafer chuck based on the position information data.

Preferably, the needle contact is lower than the wafer chuck, and the shield line is grounded.

To achieve the second objective, the present invention provides a method of calibrating the timing of signals that are applied to a plurality of needles for testing a wafer, using a wafer probing system including a probe card with the needles mounted thereon, a conductive needle contact for individually contacting one of the plurality of needles, means for moving the needle contact horizontally and vertically, a signal generator electrically connected to the probe card for generating a predetermined signal, and a measurer electrically connected to the needle contact for measuring wave form and timing of a signal. The method comprises (a) selecting a needle from the plurality of needles after determining the positions of the plurality of needles, and moving the needle contact to contact the selected needle, (b) applying a predetermined signal output from the signal generator, to the selected needle via the probe card, (c) measuring time of the signal received at the selected needle via the needle contact, and (d) based on said measuring, calibrating the timing of signals which are received at the needles, after repeating the steps (a), (b) and (c) for each needle.

Preferably, the positions of the needles in step (a) are ascertained using a camera.

Therefore, in accordance with the present invention, signals applied to wafer probing needles can be accurately calibrated.

BRIEF DESCRIPTION OF THE DRAWINGS

The above objectives and advantages of the present invention will become more apparent by describing in detail preferred embodiments thereof with reference to the attached drawings in which.

DESCRIPTION OF THE PREFERRED EMBODIMENTS

Figure 1:
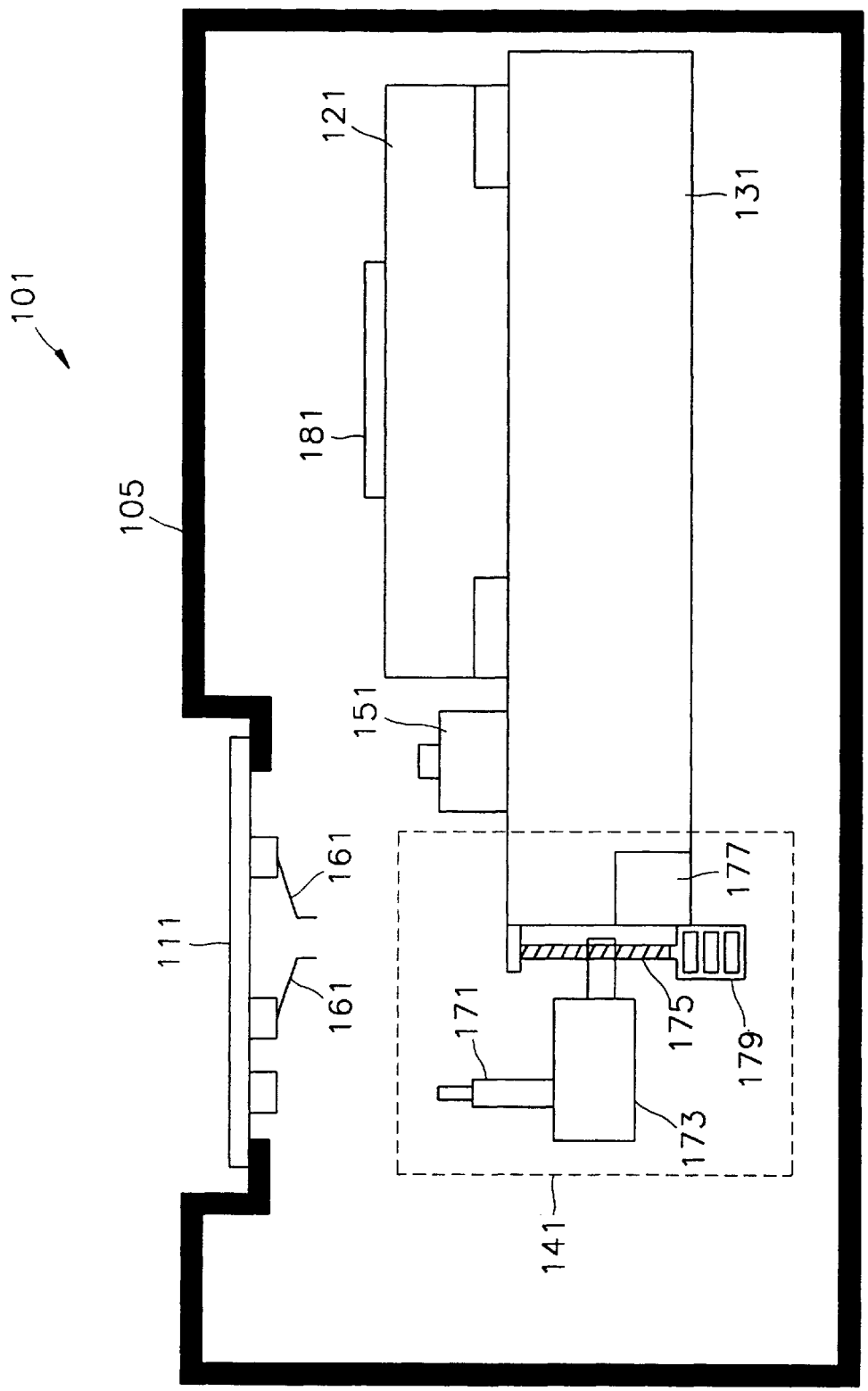
FIG. 1 is a schematic cross-sectional side view of a wafer probing system according to a first embodiment of the present invention.

The attached drawings for illustrating a preferred embodiment of the present invention, and the contents written on the attached drawings must be referred to in order to gain a sufficient understanding of the merits of the present invention, the operation thereof, and the objects accomplished by the operation of the present invention.

Hereinafter, the present invention will be described in detail by explaining a preferred embodiment of the present invention with reference to the attached drawings. Like reference numerals in the drawings denote the same members.

Figure 2A:
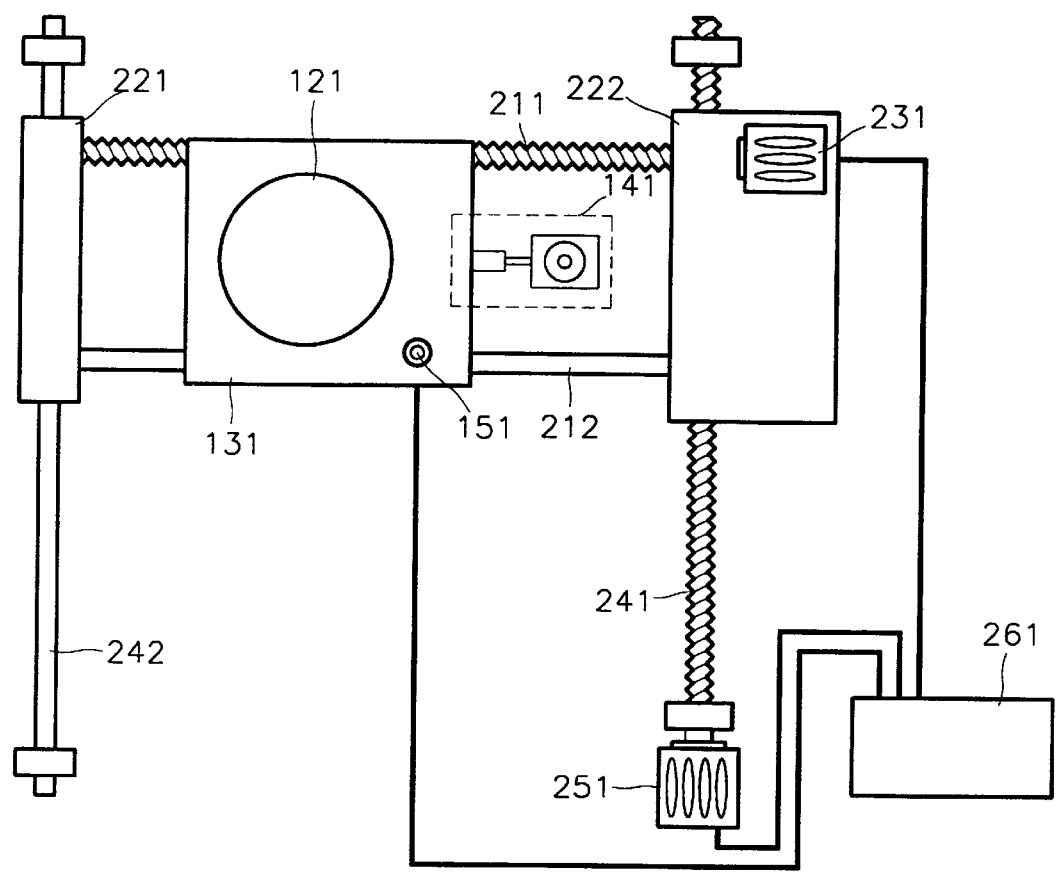
FIGS. 2A and 2B are a schematic plan view and a schematic side view, respectively, of the wafer chuck support and the apparatuses for controlling the wafer chuck support shown in FIG. 1.
Figure 2B:
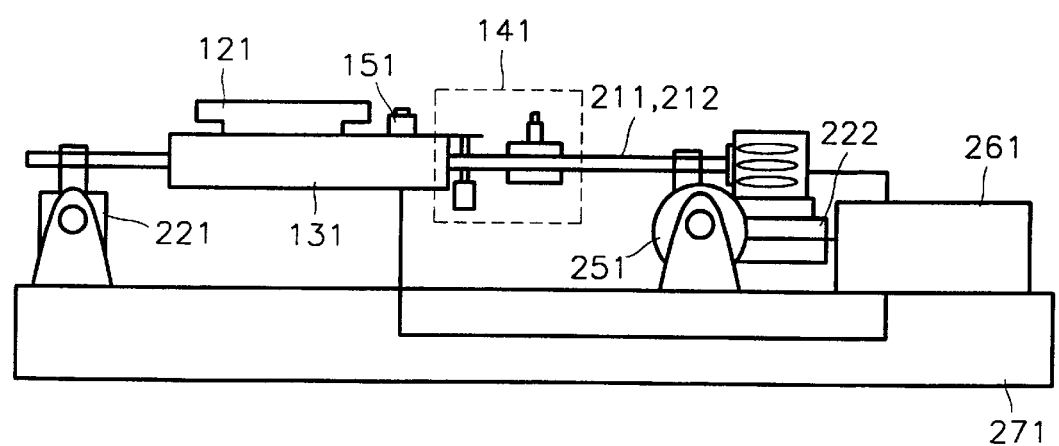

Referring to FIG. 1, a wafer probing system according to a first embodiment of the present invention includes a main body 105, a probe card 111, a wafer chuck 121, a wafer chuck support 131, a sub-chuck 141, and a camera 151. A wafer 181 is loaded on the wafer chuck 121. A plurality of integrated circuit chips are formed on the wafer 181. FIGS. 2A and 2B show an apparatus for controlling the wafer chuck support 131. In detail, the wafer chuck support 131 is positioned on X-axis rails 211 and 212 and rides along the X-axis rails 211 and 212. The X-axis rail 211 is screw-shaped. The X-axis rails 211 and 212 are horizontally fixed by rail supports 221 and 222. A step motor 231 is installed on the rail support 222, and rotates the X-axis rail 211. As the X-axis rail 211 rotates, the wafer chuck support 131 moves in the direction of the X axis. The rail supports 221 and 222 are positioned on Y-axis rails 241 and 242, and moved in the direction of the Y-axis thereby. A step motor 251 is installed on one end of the Y-axis rail 241. The step motor 251 rotates the Y-axis rail 241, and the rail supports 221 and 222 move in the direction of the Y-axis with rotation of the Y-axis rail 241. A controller 261 is connected to the step motors 231 and 251, and drives the same. The controller 261 and the rail supports 221 and 222 are installed on a main support 271. The main support 271 can be moved up and down by a motor (not shown). The direction of movement of the wafer chuck support 131 and the rail supports 221 and 222 may vary depending on the structure and characteristics of the wafer probing system 101 of FIG. 1.

The probe card 111 of FIG. 1 is placed on the wafer chuck 121. A plurality of needles 161 (see FIG. 1) are installed on the probe card 111. The plurality of needles 161 contact the bonding pads of an integrated circuit chip. The camera 151 is mounted on the wafer chuck support 131, and views the needles 161 mounted on the probe card 111 and transmits a photographic image or other x-y positional information to the controller 261. The controller 261 analyzes the photographic image and locates the positions of the needles 161 to accurately contact the wafer 181 or the sub chuck 141 with the needles 161. The camera 151 is mounted on the wafer chuck support 131, such that it moves in every direction along with the wafer chuck 121.

Figure 3:
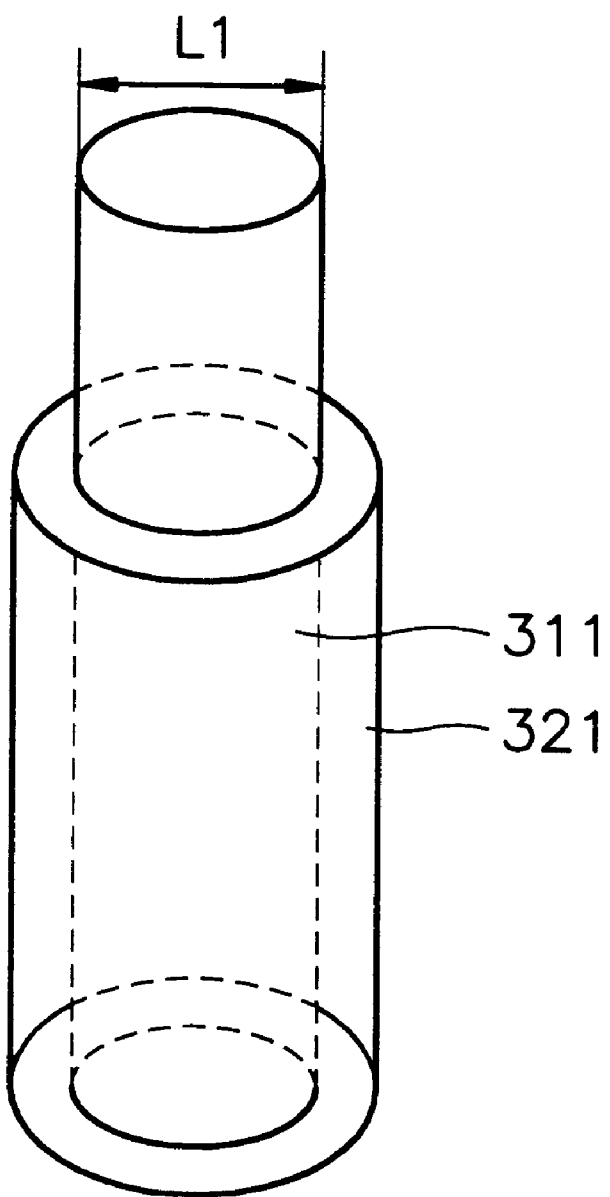
FIG. 3 is a magnified view of the needle contact shown in FIG. 1.

The sub-chuck 141 includes a needle contact 171 and moving means 173, 175, 177 and 179 as shown in FIG. 1. The needle contact 171 is shown in detail in FIG. 3. The needle contact 171 includes a signal line 311 and a shield line 321 which surrounds the signal line 311. The shield line 321 is grounded. The shield line 321 is stripped at one end to expose the signal line 311 to enable it to contact one of the needles 161. This structure also prevents the signal line 311 from contacting another adjacent needles when the signal line 311 contacts the needle 161. The diameter L1 of the signal line 311 is smaller than the distance between needles 161. The diameter L1 is set to be similar to the length of one side of a bonding pad of an integrated circuit chip. The lengths of the four sides of a bonding pad of the integrated circuit chip are generally the same. Thus, as the bonding pad size of the integrated circuit chip decreases, the diameter of the signal line 311 becomes smaller accordingly. The height of the needle contact 171 is set to be lower than the wafer chuck 121 to prevent the needle contact 171 from being damaged by the probe card 111 while a wafer is being tested.

The moving means 173, 175, 177 and 179 (See FIG. 1) may take the form of a needle contact support 173, a vertical rail 175, a needle contact controller 177, and a motor 179. The needle contact 171 is mounted on the needle contact support 173. The needle contact support 173 is connected to the vertical rail 175, and moves up and down with rotation of the vertical rail 175. A motor 179, for example, a step motor, is attached to the vertical rail 175, and rotates the vertical rail 175. The motor 179 is controlled by the needle contact controller 177. The needle contact controller 177 can be included in the controller 261 of FIG. 2.

Figure 4A:
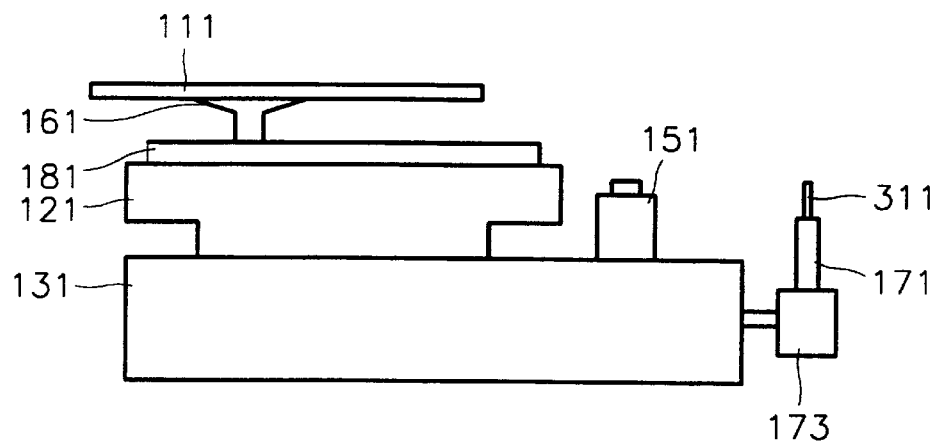
FIGS. 4A and 4B are cross-sectional views of one of the needles of FIG. 1 which contacts a wafer loaded on a wafer chuck, and which contacts a needle contact, respectively.
Figure 4B:
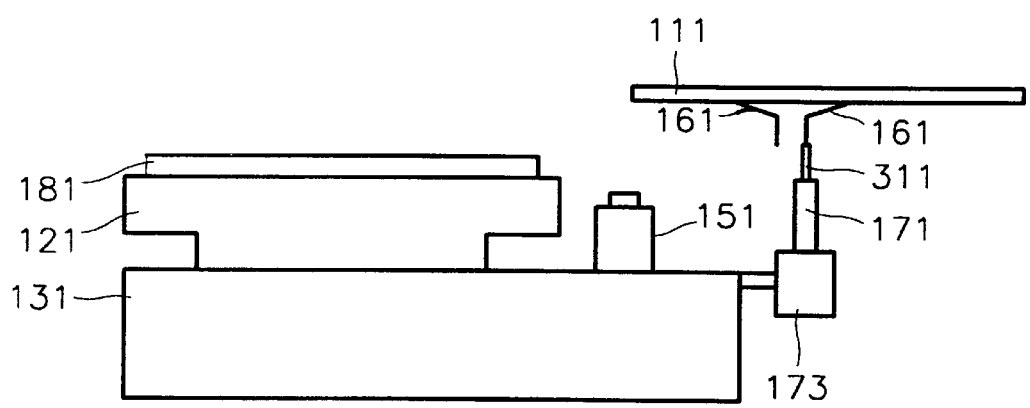

FIG. 4A shows the wafer 181 in contact with the needles 161, and FIG. 4B shows the needle contact 171 in contact with the needles 161. As shown in FIGS. 4A and 4B, in order to test the wafer 181 loaded on the wafer chuck 121, the wafer chuck support 131 horizontally moves to align the wafer chuck 121 with the probe card 111. Then the wafer chuck support 131 is lifted to contact the bonding pads of a selected integrated circuit chip with the needles 161.

On the other hand, in order to contact the needle contact 171 with one of the needles 161, the wafer chuck support 131 horizontally moves to align the needle contact 171 with the probe card 111. Then the needle contact support 173 is lifted to contact the needle contact 171, i.e., signal line 311 with one of the needles 161. The signal line 311 contacts the needles 161, one at a time.

Figure 5:
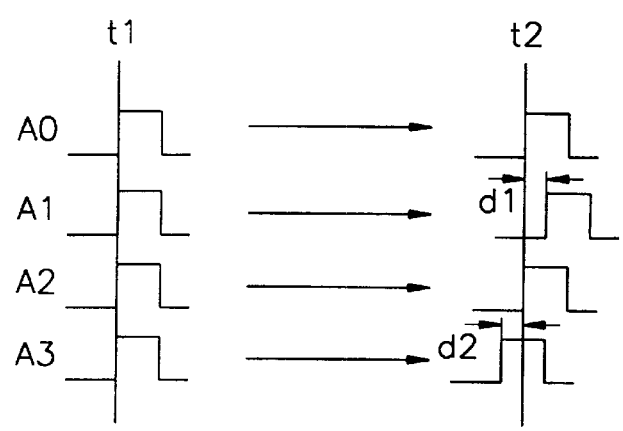
FIG. 5 is a waveform diagram of signals which are applied to needles.
Figure 6:
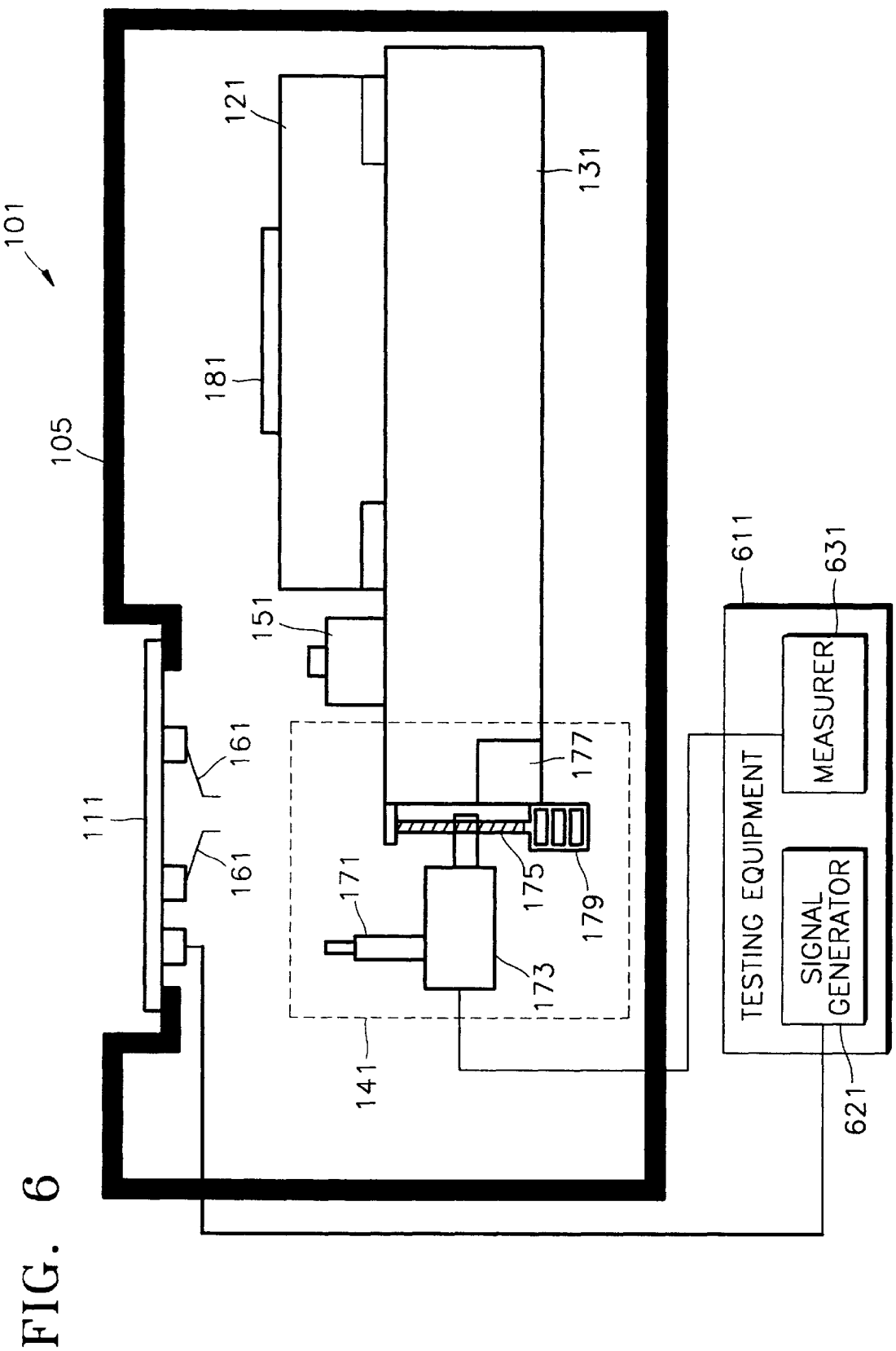
FIG. 6 is for illustrating a method of measuring the time a[009f] which signals reach needles.

When signals are applied from testing equipment 611 of FIG. 6 to needles 161 to test an integrated circuit chip, the signals must reach the needles 161 at the same time. However, signals, e.g., AO through A3, may reach the needles 161 at different times as shown in FIG. 5. As a result, the testing equipment 611 of FIG. 6 cannot accurately test the electrical characteristics of an integrated circuit chip. Accordingly, in order to accurately test the electrical characteristics of an integrated circuit chip, the signals AO through A3 must be controlled so that they can simultaneously reach the needles 161. That is, each of the signals AO through A3 is calibrated to reach the needles 161 at the same time by slightly delaying the signals AO, A2 and A3 with respect to the signal AI which is output from the testing equipment 611 of FIG. 6 and is the last signal to reach the needles 161.

In order to calibrate signals applied to the needles 161, the testing equipment 611 is electrically connected to the wafer probing system 101 as shown in FIG. 6. The testing equipment 611 includes a signal generator 621 and a measurer 631. The signal generator 621 is electrically connected to the probe card 111, and the measurer 631 is electrically connected to the needle contact 171. First, the needle contact 171 is lifted to contact one of the needles 161. At this stage, the signal generator 621 applies a signal to one of the needles 161 via probe card 111. Then, the measurer 631 receives the signal via needle contact 171. The measurer 631 measures the time period from the point (in time) the signal is output from the signal generator 621 to the point (in time) it reaches the measurer 631. Using the same method, the measurer 631 measures the time period for each one of the needles 161 mounted on the probe card 111. The testing equipment 611 compares these time periods, and calibrates the signals based on the last signal to arrive at the measurer 631 or the corresponding one of needles 161.

Figure 7:
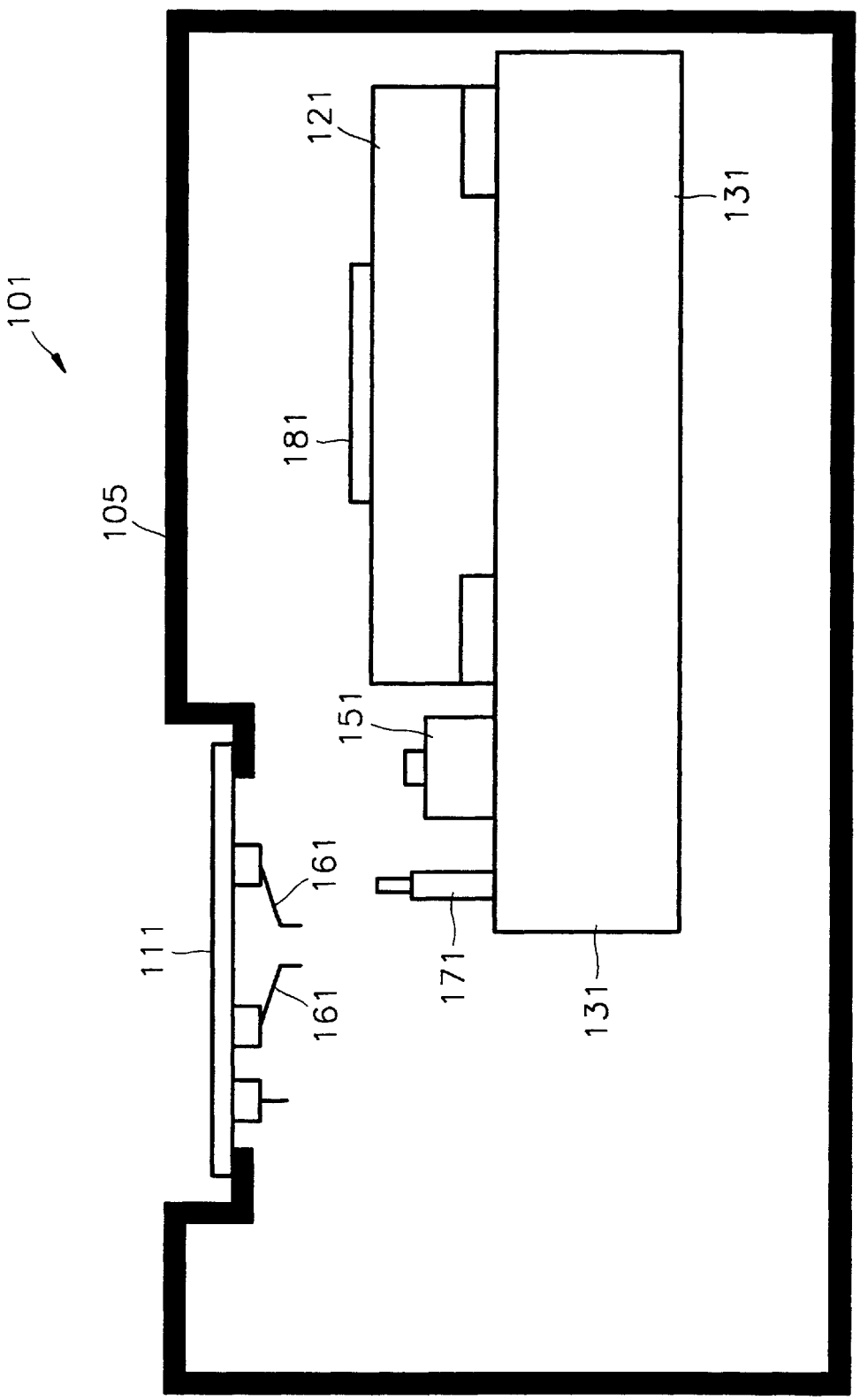
FIG. 7 is a schematic cross-sectional side view of a wafer probing system according to a second embodiment of the present invention.

FIG. 7 is a schematic cross-sectional side view of a wafer probing system according to a second embodiment of the present invention. Particularly, the needle contact 171 is installed on the wafer chuck support 131. The wafer chuck support 131 and a fixing device, i.e., a main support 271 of FIG. 2B move in every direction to contact the needle contact 171 with the needles 161. Thus, the moving means 173, 175 and 177 shown in FIG. 1 are not required. Other operations are the same as those described in FIG. 1.

Figure 8:
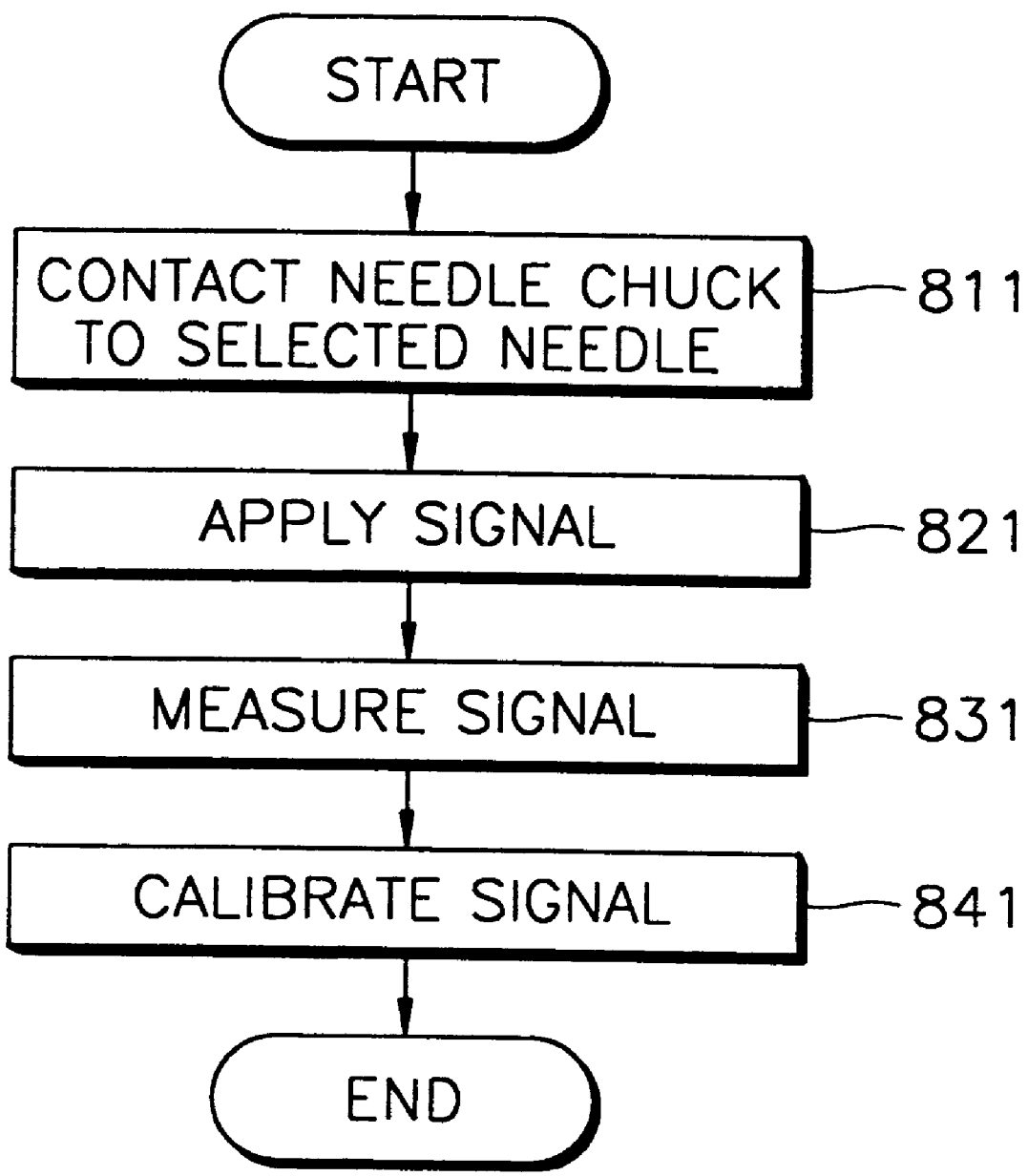
FIG. 8 is a flowchart illustrating a method of calibrating wafer probing needles according to a preferred embodiment of the present invention.

FIG. 8 is a flowchart illustrating one example of a method of calibrating waferprobing needles according to a preferred embodiment of the present invention. A method of calibrating signals, which reach the wafer probing needles shown in FIG. 1, will now be described with reference to FIG. 8.

First, in needle contact step 811, accurate positioning of the plurality of needles 161 can be achieved using the camera 151. One of the plurality of needles 161 is selected, and the wafer chuck support 131 and the needle contact 171 are moved to contact the signal line 311 of the needle contact 171 (see FIG. 3) with the selected one of the needles using position information of the needles 161 obtained through the camera 151.

Next, in a signal-applying step 821, the signal generator 621 outputs a predetermined signal and transmits the predetermined signal to the probe card 111. Then, the predetermined signal is transmitted to the selected needle via an internal circuit of the probe card 111.

After this, in a signal measuring step 831, the measurer 631 measures the time period of a signal transmitted via the needle contact 311 which contacts the selected needle using the method as described above.

Next, in a signal calibrating step 841, the needle contact 171 is horizontally moved to contact the other needle, and applies a signal to the other needle and measures the time period for the signal using the method as described above.

In this method, signals are applied to each and every one of the needles 161. The applied signals are compared and analyzed using the data on the time period obtained by the measurer 631. As a result, the signals can be calibrated based on the last signal having the longest time period. When necessary, the voltage and current of signals which are applied to the needles 161 can be measured and controlled.

When integrated circuit chips on a wafer are tested with calibrated signals, the electrical characteristics of the integrated circuit chips can be accurately tested.

According to the present invention, as described above, signals applied to needles 161 can be calibrated by contacting a needle contact 171, i.e. signal line 311, to each and every one of the needles 161 mounted on the wafer probe card 111. This way, the waveform of a signal output from each of the needles 161 and the calibration state of each of theneedles 161, and a current and voltage flowing through each of the needles 161 can be determined. This allows the electrical characteristics of an integrated circuit chip to be accurately measured.

Although the invention has been described with reference to particular embodiments, it will be apparent to one of ordinary skill in the art that modifications of the described embodiment may be made without departing from the spirit and scope of the invention.

What is claimed is:

1. A wafer probing system including a probe card on which a plurality of needles are mounted, the system comprising:

a main support;

a wafer chuck mounted on the main support;

a needle contact for contacting one of the plurality of needles,
wherein the needle contact comprises a conductive signal line, positioning means for determining the position of the plurality of needles;

means for horizontally moving the main support based upon the determined position of the plurality of needles; and moving means for vertically moving the needle contact, said moving means being coupled to the main support.

2. The wafer probing system of claim 1, wherein the diameter of the signal line is smaller than the distance between the needles.

3. The wafer probing system of claim 1, wherein said needle contact further comprising a shield line for shielding the signal line.

4. The wafer probing system of claim 1, wherein said moving means comprises:

a needle contact support;

a rail for vertically moving the needle contact support;

a motor for moving the rail; and a needle contact controller for controlling the motor.

5. The wafer probing system of claim 4, wherein said motor is a step motor.

6. The wafer probing system of claim 1, wherein said needle contact is positioned lower than said wafer chuck.

7. The wafer probing system of claim 1, wherein the shield line is grounded.

8. The wafer probing system of claim 1, wherein said positioning means is mounted on the main support.

9. A wafer probing system structured to accept a probe card on which a plurality of needles are mounted, the system comprising:

a main support;

a wafer chuck mounted on the main support and structured to accept a wafer for testing;

a needle contact coupled to the main support and having a conductive signal line;

a wafer chuck positioner coupled to the main support and structured to position the wafer chuck in a position to touch one of the plurality of needles to such a testing wafer; and a needle contact positioner coupled to the main support and structured to position the needle contact in a position to touch one of the plurality of needles.

10. The wafer probing system of claim 9 wherein the wafer chuck positioner comprises:

an x-axis platform coupled to a first positional motor; and a y-axis platform coupled to a second positional motor.

11. The wafer probing system of claim 10 wherein the needle contact positioner comprises a z-axis platform coupled to a third positional motor.

12. The wafer probing system of claim 10 wherein the y-axis platform is mounted on the x-axis platform.

13. The wafer probing system of claim 9 wherein the conductive signal line has a diameter less than a distance between any of the plurality of needles.

14. The wafer probing system of claim 9 wherein the conductive signal line is shielded.

15. The wafer probing system of claim 14 wherein the conductive signal line is grounded.

16. The wafer probing system of claim 9 wherein the needle contact is coupled to a needle signal measuring circuit.

\* \* \* \* \*